United States Patent
Lu et al.

(10) Patent No.: US 9,954,522 B2
(45) Date of Patent: Apr. 24, 2018

(54) HYBRID SWITCH INCLUDING GAN HEMT AND MOSFET

(71) Applicant: HELLA GmbH & Co. KGaA, Lippstadt (DE)

(72) Inventors: Juncheng Lu, Flint, MI (US); Hua Bai, Flint, MI (US); Hui Teng, Flint, MI (US)

(73) Assignee: HELLA GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 15/639,183

(22) Filed: Jun. 30, 2017

(65) Prior Publication Data

US 2018/0026628 A1 Jan. 25, 2018

Related U.S. Application Data

(63) Continuation of application No. 15/261,051, filed on Sep. 9, 2016, now Pat. No. 9,735,771.

(Continued)

(51) Int. Cl.
*H03B 1/00* (2006.01)
*H03K 3/00* (2006.01)
(Continued)

(52) U.S. Cl.
CPC .......... *H03K 17/284* (2013.01); *H01L 29/16* (2013.01); *H01L 29/2003* (2013.01); *H01L 29/7787* (2013.01); *H01L 29/7805* (2013.01)

(58) Field of Classification Search
USPC ................................................ 327/108–112
See application file for complete search history.

(56) References Cited

U.S. PATENT DOCUMENTS 5,123,746 A * 6/1992 Okado ................ H02M 7/5387
  363/37
6,172,550 B1 * 1/2001 Gold ...................... H03K 17/92
  327/110
(Continued)

FOREIGN PATENT DOCUMENTS

EP     3 089 346      2/2016
JP     2016/052197    4/2016
(Continued)

OTHER PUBLICATIONS

"How to Drive GaN Enhancement Mode Power Switching Transistors", GaN Systems, Inc., pp. 1-13, Oct. 21, 2014.
(Continued)

*Primary Examiner* — Adam Houston
(74) *Attorney, Agent, or Firm* — Dykema Gossett PLLC

(57) ABSTRACT

A hybrid switch apparatus includes a gate drive circuit producing a gate drive signal, a GaN high electron mobility transistor (HEMT) having a first gate, a first drain, and a first source. A silicon (Si) MOSFET has a second gate, a second drain, and a second source. The GaN HEMT and the Si MOSFET are connected in a parallel arrangement so that (i) the first drain and the second drain are electrically connected and (ii) the first source and the second source are electrically connected. The second gate is connected to the gate drive circuit output to receive the gate drive signal. A delay block has an input connected to the gate drive circuit output and an delay block output is configured to produce a delayed gate drive signal for driving the GaN HEMT.

20 Claims, 5 Drawing Sheets

Related U.S. Application Data

(60) Provisional application No. 62/365,157, filed on Jul. 21, 2016.

(51) Int. Cl.
*H03K 17/284* (2006.01)
*H01L 29/78* (2006.01)
*H01L 29/16* (2006.01)
*H01L 29/778* (2006.01)
*H01L 29/20* (2006.01)

(56) References Cited

U.S. PATENT DOCUMENTS

| | | | | |
|---|---|---|---|---|
| 7,965,126 | B2* | 6/2011 | Honea | H03K 17/08142 327/110 |
| 9,443,787 | B2* | 9/2016 | Otremba | H01L 23/49575 |
| 9,443,938 | B2* | 9/2016 | Mishra | H01L 29/2003 |
| 9,484,908 | B1 | 11/2016 | Lu et al. | |
| 9,536,967 | B2* | 1/2017 | Kikkawa | H01L 29/7786 |
| 2002/0125920 | A1* | 9/2002 | Stanley | H02M 1/08 327/108 |
| 2005/0281066 | A1* | 12/2005 | Wheeler | H02M 5/293 363/131 |
| 2007/0035481 | A1 | 2/2007 | Kim | |
| 2008/0122497 | A1 | 5/2008 | Ishikawa et al. | |
| 2009/0201072 | A1 | 8/2009 | Honea et al. | |
| 2010/0245301 | A1* | 9/2010 | Shang | G09G 3/3677 345/204 |
| 2012/0280728 | A1 | 11/2012 | Hussein et al. | |
| 2013/0321038 | A1* | 12/2013 | Zhao | H03K 17/063 327/109 |
| 2014/0225163 | A1* | 8/2014 | Briere | H01L 27/0248 257/195 |
| 2015/0014698 | A1* | 1/2015 | Briere | H03K 17/107 257/76 |
| 2015/0116024 | A1 | 4/2015 | Ishikawa et al. | |
| 2015/0256155 | A1* | 9/2015 | Haeberlen | H03K 3/012 327/109 |

FOREIGN PATENT DOCUMENTS

| | | |
|---|---|---|
| WO | WO 2013150567 | 10/2013 |
| WO | WO 2015/097836 | 2/2015 |
| WO | WO 2016/014907 | 1/2016 |

OTHER PUBLICATIONS

Lidow, et al., "eGaN FET Drivers and Layout Considerations", EPC Efficient Power Conversion, White Paper: VVP008, pp. 1-7, 2012.
Bai et al., "Design of an 11 kW power factor correction and 10 kW ZVS DC/DC converter for a high-efficiency battery charger in electric vehicles," IET Power Electronics, pp. 1-9, Sep. 18, 2012.
"LM 5113 100 V 1.2-A /5-A, Half-Bridge Gate Driver for Enhancement Mode GaN FETs", Texas Instruments, 26 pgs., Jun. 2011.
Annex to Form PCT/ISA/206, Communication Relating to the Results of the Partial International Search relating to PCT/IB2017/054407, dated Nov. 7, 2017.
Annex to Form PCT/ISA/206, Communication Relating to the Results of the Partial International Search relating to PCT/IB2017/054410, dated Nov. 7, 2017.
English Language Abstract of JP 2016 052197.

* cited by examiner

HYBRID SWITCH INCLUDING GAN HEMT AND MOSFET

CROSS-REFERENCE TO RELATED APPLICATIONS

This application is a continuation of U.S. application Ser. No. 15/261,051 filed 9 Sep. 2016 (the '051 application), now pending, which claims the benefit of U.S. provisional application No. 62/365,157, filed 21 Jul. 2016 (the '157 application). The '051 application and the '157 application are both hereby incorporated by reference as though fully set forth herein.

BACKGROUND a. Technical Field

The instant disclosure relates generally to power electronics systems, and more particularly to a hybrid switch including a GaN high electron mobility transistor (HEMT) and a silicon (Si) metal-oxide-semiconductor field-effect transistor (MOSFET).

b. Background

This background description is set forth below for the purpose of providing context only. Therefore, any aspects of this background description, to the extent that it does not otherwise qualify as prior art, is neither expressly nor impliedly admitted as prior art against the instant disclosure.

In a power electronics circuit, a high-current power capability can be provided by electrically connecting a plurality of semiconductor switches in a paralleled arrangement so as to permit the undertaking of the load current together. A paralleled arrangement is desirable because such a paralleled arrangement can collectively have a much lower conduction resistance as compared to a single switch. The reduced conduction resistance can reduce a conduction loss, which can increase an overall system efficiency. Silicon switches (e.g., MOSFET) are known for use in power applications; however, such switches are not operated at very high switching frequency due to relatively high switching losses.

Wide-bandgap (WBG) devices, such as Silicon Carbide (SiC) and Gallium Nitride (GaN) devices are becoming more popular due to their higher switching frequency capability, lower switching loss and higher thermal capability as compared to conventional silicon (Si) devices. However, WBG devices still have their own challenges.

First, its current capability compared to the Silicon devices is still not high enough for some applications. For such high-current applications, it is required to parallel multiple WBG switches, which increases the system cost. Second, particularly for a so-called GaN high electron mobility transistor (HEMT) device, its reverse conduction loss is much higher than, for example, a silicon MOSFET device when the switch is not "on". This reverse conduction loss characteristic limits system efficiency.

There is therefore a need to overcome one or more of the problems in the art.

The foregoing discussion is intended only to illustrate the present field and should not be taken as a disavowal of claim scope.

SUMMARY

Present approaches that use silicon switching devices (e.g., MOSFETs) typically are not operated a very high switching frequencies due to relatively high switching losses, while present approaches that use GaN HEMTs have a relatively larger forward/reverse conduction loss. An apparatus according to the present teachings parallels a wide-bandgap device (e.g., GaN HEMT) to a silicon switch (e.g., Si MOSFET) at zero voltage switching (ZVS) turn-on applications. Generally, the switching frequency of the apparatus will be much higher than for silicon switch only systems since the turn-off loss of, for example, GaN HEMT is substantially negligible. Additionally, the conduction loss is for the most part undertaken by the, for example, Si MOSFET switch. In an alternate embodiment, further Si MOSFET switches can be paralleled together in order to further drop the conduction loss, and will not significantly increase the system cost. An embodiment according to the instant teachings provides an economic solution without sacrificing the high frequency switching performance of GaN HEMT devices as well as facilitate design of a high-efficiency, high-power-density and low cost power electronics system.

An apparatus according to the instant disclosure includes a gate drive circuit having at least one gate drive output configured to produce a gate drive signal thereon, a wide-bandgap switching device, for example, a high electron mobility transistor (HEMT) where the HEMT has a first gate, a first drain, and a first source. The apparatus further includes a semiconductor switch having a second gate, a second drain, and a second source. The HEMT and the semiconductor switch are connected in a parallel arrangement wherein (i) the first drain and the second drain are electrically connected and (ii) the first source and the second source are electrically connected. The second gate is connected to the gate drive circuit output to receive the gate drive signal. The apparatus further includes a delay block having an input connected to the gate drive circuit output and an output configured to produce a delayed gate drive signal. The first gate of the HEMT is connected to the delay block output to receive the delayed gate drive signal.

A method of operation is also presented.

The foregoing and other aspects, features, details, utilities, and advantages of the present disclosure will be apparent from reading the following description and claims, and from reviewing the accompanying drawings.

DETAILED DESCRIPTION

Figure 1:
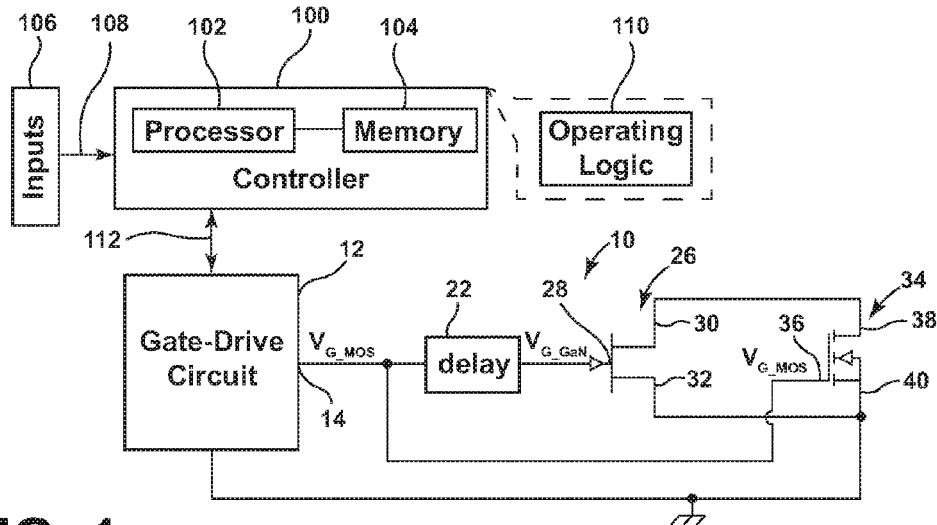
FIG. 1 is diagrammatic schematic and block diagram of an apparatus with paralleled transistors according to an embodiment of the instant disclosure.

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments, the scope of which is defined solely by the appended claims.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

Switching Losses.

As described above, silicon switches (e.g., MOSFETs) generally experienced switching losses when, for example, they are switched off. As will be described below in greater detail, the Si MOSFET will be switched off while the GaN HEMT is still on-due to a time delay inserted into the respective gate drive signals. Accordingly, there is no switching losses for the Si MOSFETs.

Reverse Conduction Loss.

A so-called reverse conduction loss for GaN HEMT devices was described above. By way of explanation, the GaN HEMT devices, because of the absence of the body diode, will have a reverse conduction mode that is different from Si MOSFETs. In particular, when $V_{gd}$ is higher than a reverse threshold voltage $V_{th\_gd}$, the two-dimensional electron gas (2DEG) of GaN HEMTs conducts the current with the voltage drop as shown in equation (1).

$$Vsd = Vth\_gd - Vgs\_off + id * Rdson \quad (1)$$

In order to prevent a potential shoot-through in a bridge circuit, a negative $V_{gs\_off}$ is always preferred to turn off GaN HEMT switches, which however increases the dead-band loss. For example, for the 650V/60V GaN HEMT provided by GaN Systems Inc, the $V_{th\_gd}$=2V. When $V_{gs\_off}$=−5V to turn off the GaN HEMT switch, which is typical for normal for Si or SiC MOSFETs, the reverse voltage drop of the GaN HEMT will be at least 7V (e.g., as per equation (1)). To solve such issue of undue reverse conduction loss, options could include either reducing $V_{gs\_off}$ to zero, or alternatively to shrink the deadband (i.e., to shorten the time when the GaN HEMT switch is OFF). Both of these options may impair the proper operation of the system.

To more fully utilize the merits of GaN HEMT switches and avoid its relatively large reverse conduction loss, accordingly to the teachings of the instant application, a hybrid switch is provided which uses a GaN HEMT switch paralleled with a Si MOSFET switch. As will be described below, such a hybrid switch apparatus overcomes the reverse conduction loss in the GaN HEMT switch while also overcoming switching losses in a Si MOSFET switch, when used in zero-voltage-switching (ZVS) turn-on applications.

Figure 2:
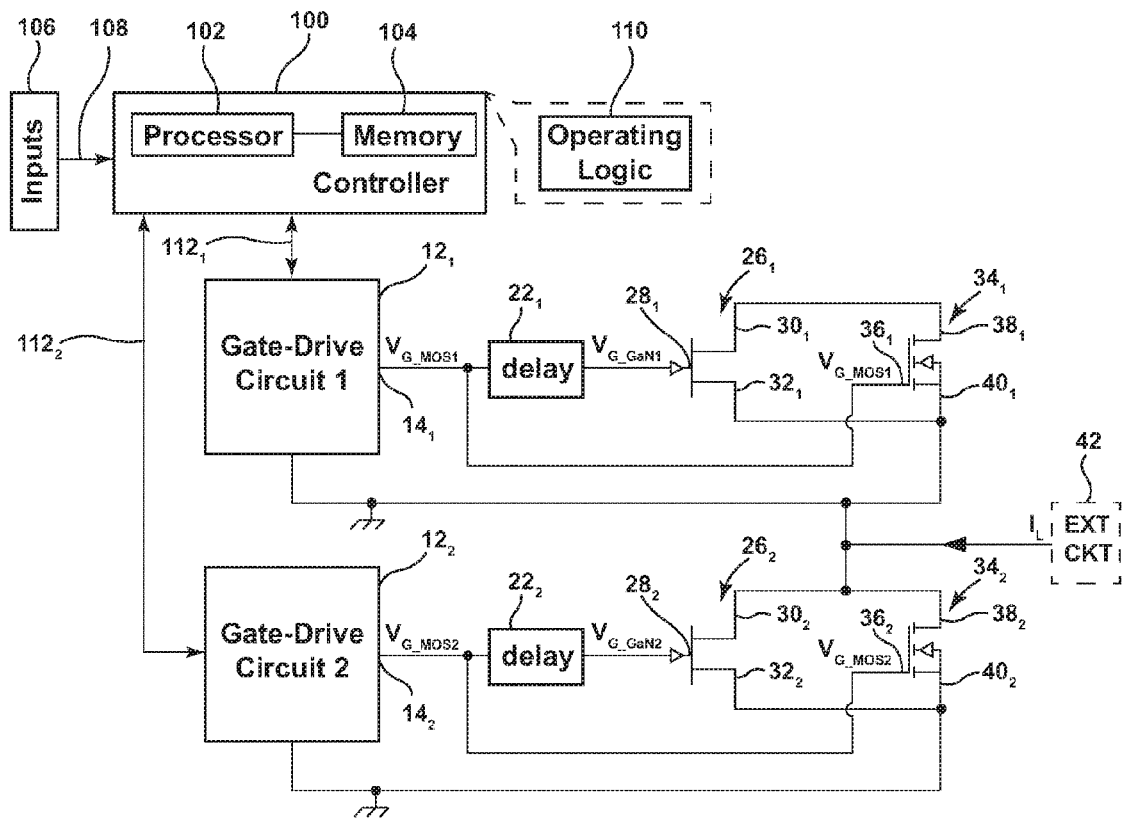
FIG. 2 is a schematic diagram of an alternate embodiment using a replication of the arrangement of FIG. 1.

Referring now to the drawings wherein like reference numerals are used to identify identical or similar components in the various views, FIG. 1 is a diagrammatic view of an embodiment of a hybrid switch apparatus 10. Apparatus 10 comprises a paralleled switch arrangement suitable for use in a power electronics system. The embodiment of FIG. 1 may be considered a single switch arrangement that can be replicated for use in larger constructs, such as shown in FIG. 2 in the application of a bridge, to be connected with respect to a load(s) and/or power source in a variety of ways known in the art.

In the illustrated embodiment, apparatus 10 includes a gate drive circuit 12 having at least one gate drive circuit output 14. The gate drive circuit 12 may comprise a semiconductor chip and further be configured to respond to a variety of input signals (e.g., voltage and/or current inputs) in order to output, among other things, a gate drive signal 16 (best shown in FIG. 3) at the gate drive circuit output 14. In particular, the gate drive circuit 12 may produce the gate drive signal 16 in accordance with a predetermined control approach. The art is replete with exemplary control strategies, and is dependent on the particular application. Alternatively, the processing needed to produce a gate drive signal may be performed by, an electronic control unit (ECU) as described below in greater detail.

Figure 3:
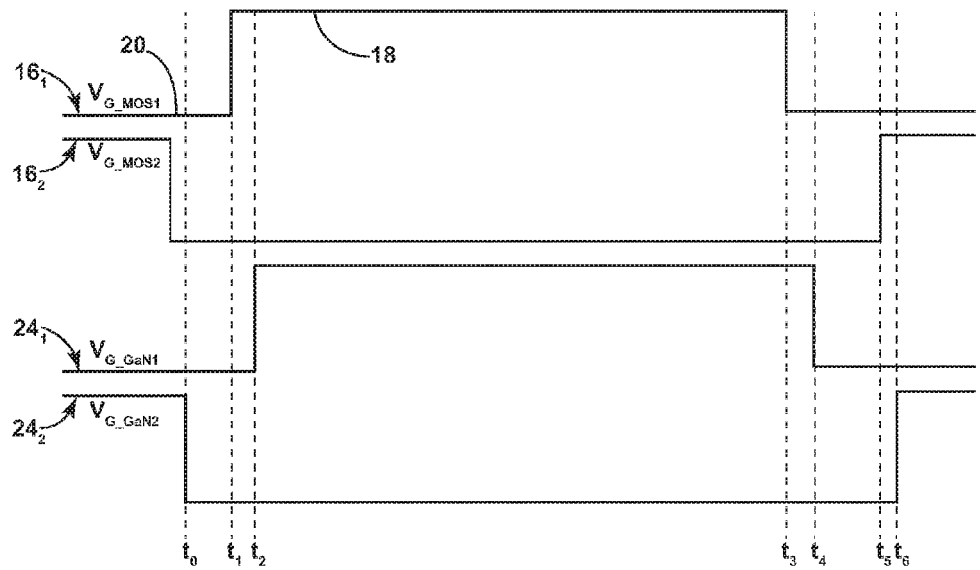
FIG. 3 illustrates simplified timing diagrams of a gate drive signal and a delayed gate drive signal reflecting the operation of the embodiment of FIG. 2.

As shown in FIG. 3, the gate drive signal 16 includes at least an ON state 18 and an OFF state 20. In an embodiment, the ON state 18, when asserted by the gate drive circuit 12, is configured to turn on the target switch, while the OFF state 20, when asserted, is conversely configured to turn off the target switch.

In an embodiment, the gate drive circuit 12 may comprise conventional apparatus commercially available in the art, for example, known MOSFET/GaN gate drive integrated circuits ("chip"). In the illustrated embodiment, for GaN HEMT devices, the gate drive circuit 12 may comprise a Half-Bridge Gate Driver for Enhancement Mode GaN FETs gate drive circuit (e.g., as in FIG. 2), model no. LM5113, commercially available from Texas Instruments, Dallas, Tex., U.S.A. In an embodiment, the gate drive signal 16, also sometimes designated $V_{G\_MOS}$ herein, may have its output voltage $V_{G\_MOS}$ ranging between about +7 V for the ON state 18 to −5 V for the OFF state 20.

While FIG. 1 shows a gate drive circuit 12, which can be a specific control device, apparatus 10 may additionally include, or may have as a substitute for the gate drive circuit 12, an electronic control unit (ECU) 100 that is configured to implement a desired control strategy for the operation of hybrid switch apparatus 10. ECU 100 includes a processor 102 and a memory 104. The processor 102 may include processing capabilities as well as an input/output (I/O) interface through which processor 102 may receive a plurality of input signals (input block 106 providing input signal(s) 108) and generate a plurality of output signals (e.g., gate drive signal(s), in an embodiment). Memory 104 is provided for storage of data and instructions or code (i.e., software) for processor 102.

Memory 104 may include various forms of non-volatile (i.e., non-transitory) memory including flash memory or read only memory (ROM) including various forms of programmable read only memory (e.g., PROM, EPROM, EEPROM) and/or volatile memory including random access memory (RAM) including static random access memory (SRAM), dynamic random access memory (DRAM) and synchronous dynamic random access memory (SDRAM).

In an embodiment, one approach for switching device turn-on control may be to employ a zero voltage switching (ZVS) strategy. As shown, the control strategy for turn-off control and turn-on control (including the ZVS control) can be implemented in terms of operating control logic 110, which comprises processor instructions that can be stored in memory 104 and are configured to be executed by processor 102. Alternatively, the operational control logic for controlling the operation of the hybrid switch apparatus 10 (i.e., turn-off and turn-on control) can be implemented in hardware. As shown, the ECU 100 may produce a control signal 112 that controls the gate drive circuit 12 to assert and de-assert the gate drive signal 16 (see FIG. 3 for timing diagram). The art is replete with teachings for implementing a zero voltage switching (ZVS) control strategy. Generally, in order to maintain zero voltage switching for switch turn-on, before the turning on action, current should reverse flow, which makes the switch voltage drop to zero. Thus, during the switch turn on, the switch only undertakes the current change with a voltage then-prevailing thereacross always being close to be zero, which in turn eliminates the turn-on loss to thereby reach the ZVS turn on. Further information may be seen by reference to U.S. application Ser. No. 14/744,988, filed 19 Jun. 2015 (the '988 application) entitled "GATE DRIVE CIRCUIT". The '988 application is hereby incorporated by reference as though fully set forth herein.

With continued reference to FIG. 1, hybrid switch apparatus 10 further includes a wide-bandgap switch, such as a GaN high electron mobility transistor (HEMT) 26 which includes a first gate 28, a first drain 30, and a first source 32. In an embodiment, the GaN HEMT switch 26 may comprise commercially available components, for example, an enhancement mode GaN transistor provided under the trade designation and/or part number GS66516T from GaN Systems Corp., Ann Arbor, Mich., USA.

The hybrid switch apparatus 10 further includes one or more silicon switches, such as a silicon (Si) metal-oxide-semiconductor field-effect transistor (MOSFET) 34 which includes a second gate 36, a second drain 38, and a second source 40. In an embodiment, the MOSFET 34 may comprise commercially available components, for example, an N-Channel power MOSFET provided under the trade designation and/or part number STY139N65M5 from STMicroelectronics, Coppell, Tex., USA.

The GaN HEMT 26 and the Si MOSFET 34 are electrically connected in a parallel arrangement to each other, wherein (i) the first drain 30 and the second drain 38 are electrically connected and (ii) the first source 32 and the second source 40 are also electrically connected. As shown in FIG. 1, the second gate 36 is electrically connected to the gate drive circuit output 14 in order to receive the gate drive signal 16 ($V_{G\_MOS}$).

The hybrid switch apparatus 10 still further includes a delay block 22 having an input connected to the gate drive circuit output 14, which input is configured to receive the gate drive signal 16 ($V_{G\_MOS}$). The delay block 22 further includes an output configured to produce a delayed gate drive signal, which is designated $V_{G\_GaN}$. The first gate 28 of the GaN HEMT 26 is electrically connected to the output of the delay block 22 in order to receive the delayed gate drive signal ($V_{G\_GaN}$). As alluded to, the delay block 22 operates to insert a time delay between the gate signals of two switches 26, 34. In an embodiment, the delay block 22 may comprise a resistor-capacitor (RC) circuit of conventional design. In an embodiment, the delay block 22 may be configured to insert a time delay of not larger than about 100 nanoseconds (ns).

FIG. 2 shows how the hybrid switch apparatus 10 may be used as part of a bridge circuit (see external circuit 42). It should be understood that the hybrid switch apparatus 10 may be used in other applications, such as, for example, a half-bridge, an H-bridge, a three-phase inverter, and the like. In this regard, as shown, the hybrid switch arrangement in the apparatus 10 of FIG. 1 is replicated, where an "upper" switch contains the same components as in the embodiment of FIG. 1 where its reference numerals include a subscript "1" while the "lower" switch contains the same components as in the embodiment of FIG. 1 where its reference numerals include a subscript "2". The source terminal of the "upper" switch, namely, the source terminals $32_1$ and $40_1$, are electrically connected, at a common node 44, to the drain terminal of the "lower" switch, namely drain terminals $30_2$ and $38_2$. As further shown, the electronic control unit 100 is configured to generate control signals $112_1$ and $112_2$ for controlling operation of the "upper" and "lower" hybrid switch apparatus, respectively.

FIG. 3 is a timing diagram of the of the gate drive signals and delayed gate drive signals applicable to the embodiment of FIG. 2. In particular, the time sequence of the gate drive signals $16_1$, $16_2$ (also shown as signals $V_{G\_MOS1}$ and $V_{G\_MOS2}$) are shown on a common time-line, as well as the corresponding delayed gate drive signals $24_1$, $24_2$ (also shown as signals $V_{G\_GaN1}$ and $V_{G\_GaN2}$).

With reference now to FIGS. 4-7, a description of the operation of the embodiment of FIG. 2 according to the signal timing shown in FIG. 3 will now be set forth. Specifically, the operation of the embodiment of FIG. 2 can be broken down in to six separate time periods or modes.

Mode 1: [$t_0$, $t_1$].

Figure 4:
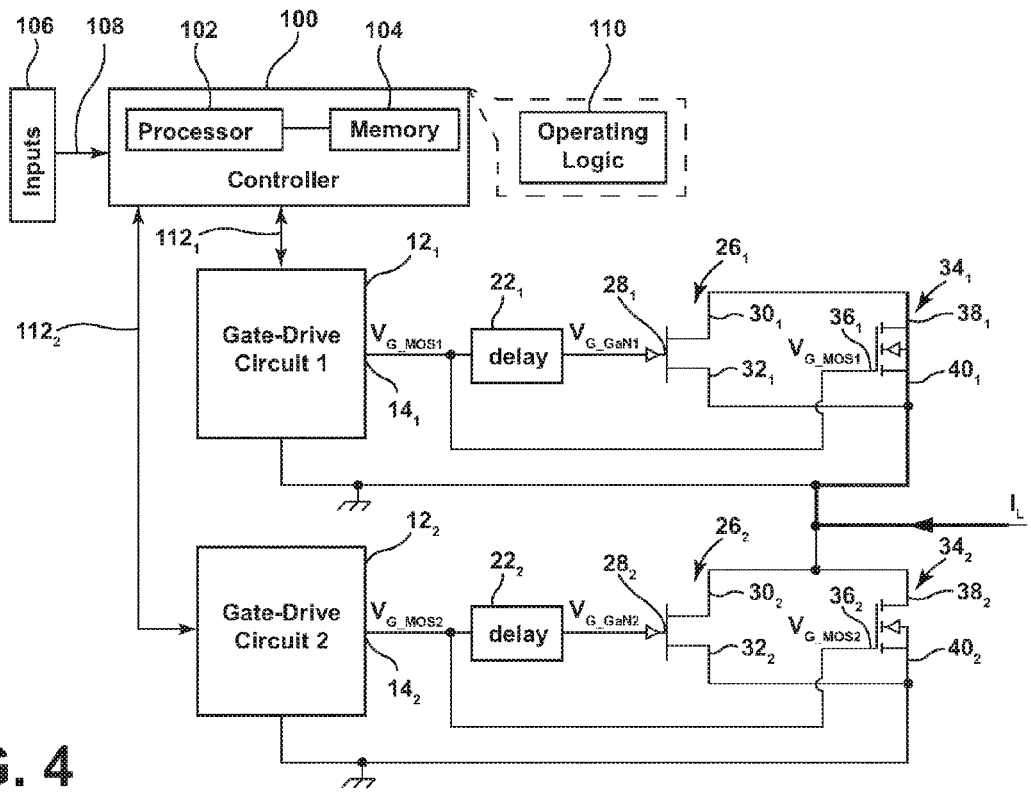
FIGS. 4-7 are schematic diagrams of the embodiment of FIG. 2 showing different modes of operation.

During the time period between times $t_0$, $t_1$, all of the switches are off (i.e., switches $26_1$, $34_1$, $26_2$, $34_2$). This is because all the gate drive signals are de-asserted and are in the OFF state. In an exemplary zero voltage switching (ZVS) application, the current $I_L$ shown in FIG. 2 will be taken to be positive—this is shown in FIG. 4. Therefore, the current $I_L$ will flow through the "upper" switch comprising GaN HEMT $26_1$ and Si MOSFET $34_1$. However, since the GaN HEMT $26_1$ exhibits a roughly 7V drop—as described above in connection with equation (1)—as compared to the only roughly 1~2V voltage drop of the body diode of Si MOSFET $34_1$, the current $I_L$ will flow through the body diode of Si MOSFET $34_1$, as shown in FIG. 4.

Mode 2: [$t_1$, $t_2$].

During the time period between times $t_1$, $t_2$, the upper Si MOSFET $34_1$ is on, while the other switches remain off (i.e., the other switches $26_1$, $26_2$, $34_2$ remain off). This is because (i) notwithstanding the assertion of the gate drive signal $16_1$ ($V_{G\_MOS1}$), the delay block 22 has time delayed the corresponding assertion of the gate drive signal $24_1$ ($V_{G\_GaN1}$); and (ii) the gate drive signals $16_2$, $24_2$ ($V_{G\_MOS2}$, $V_{G\_GaN2}$) are also both in the OFF state. ZVS application means that the current $I_L$ shown in FIG. 2 is positive—as also shown in FIG. 4. Therefore, the current $I_L$ will flow through the upper Si MOSFET $34_1$ channel. Since the GaN HEMT $26_1$ exhibits a roughly 7V drop in this example (see above in connection with Equation (1))—as compared to the much smaller voltage drop across the channel of the Si MOSFET $34_1$ (i.e., the MOSFET channel voltage drop is much smaller due to a small resistance—is ~mΩ), the current $I_L$ will flow through the Si MOSFET $34_1$ channel.

Mode 3: [$t_2$, $t_3$].

Figure 5:
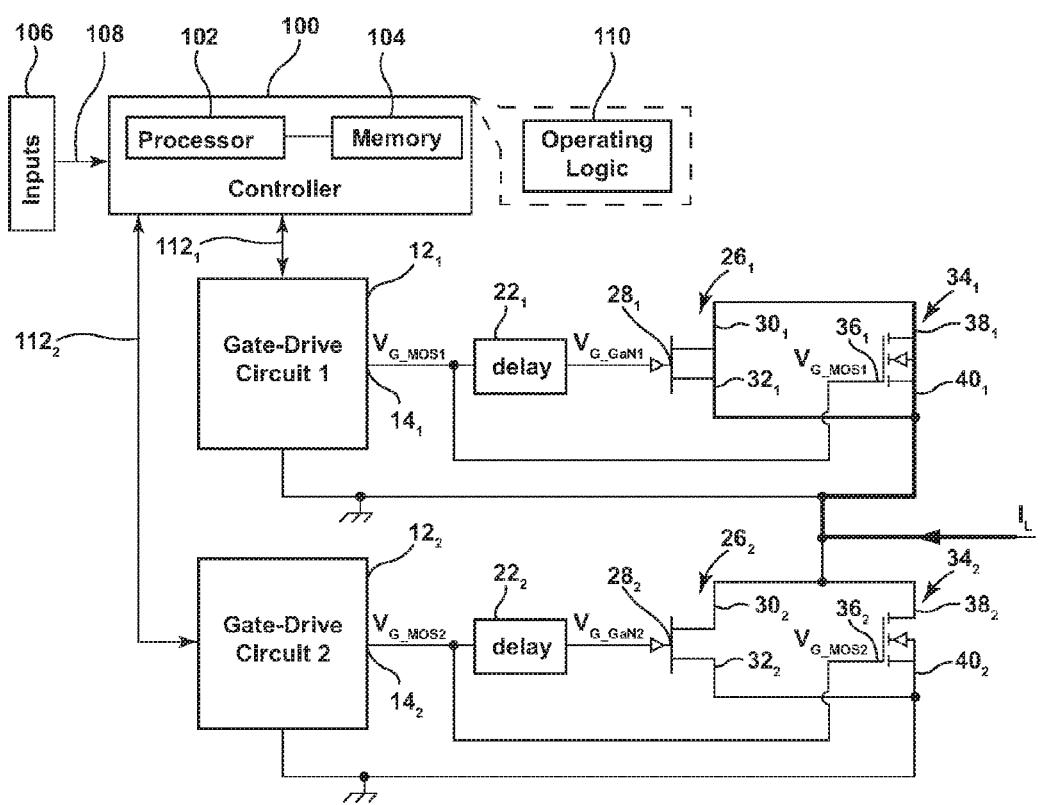
Figure 6:
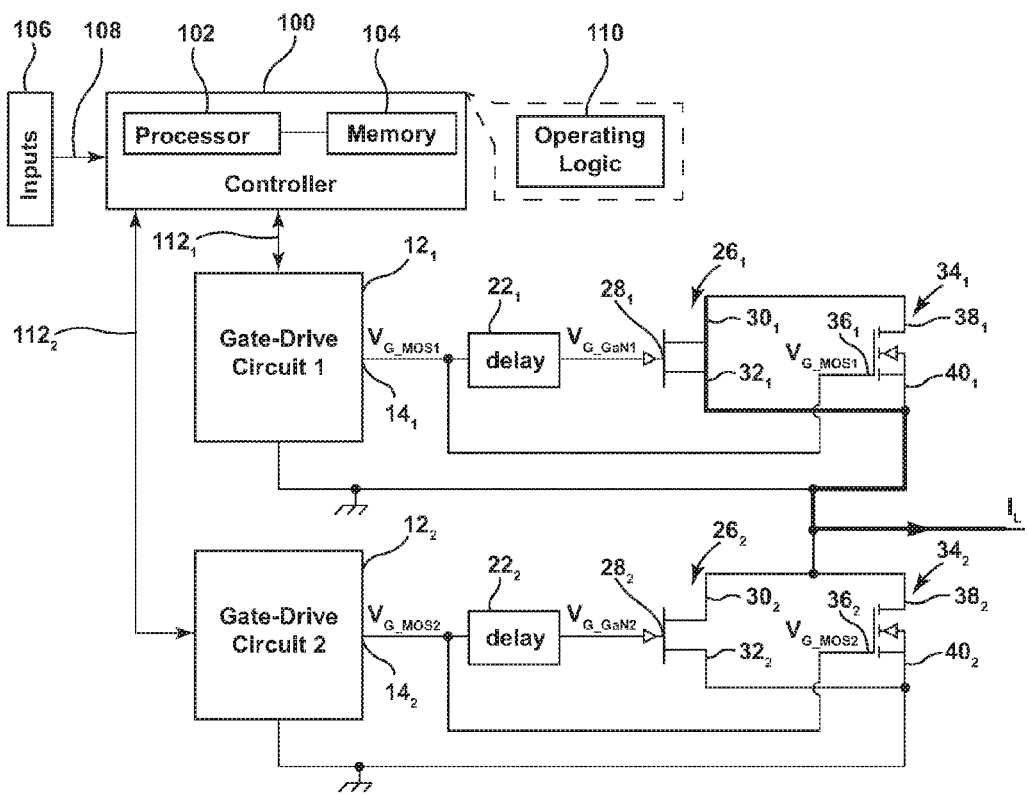

During the time period between times $t_2$, $t_3$, both the upper GaN HEMT $26_1$ and the Si MOSFET $34_1$ are on, while the lower switches remain off (i.e., the lower switches $26_2$, $34_2$ remain off). This is because the turn-on delay inserted by the delay block 22 has passed and thus both the upper gate drive and upper delayed gate drive signals $16_1$, $24_1$ ($V_{G\_MOS1}$, $V_{G\_GaN1}$) are both asserted and in the ON state, while the lower gate drive and lower delayed gate drive signals $16_2$, $24_2$ ($V_{G\_MOS2}$, $V_{G\_GaN2}$) are de-asserted and in the OFF state. In an embodiment, the MOSFET channel resistance can be made to be much smaller than that of the GaN HEMT by paralleling further Si MOSFETs (not shown), which is relatively affordable. Accordingly, as shown in FIG. 5, most of the current $I_L$ will still flow through Si MOSFET $34_1$ channel, although a smaller portion of the current $I_L$ will flow through the GaN HEMT $26_1$. Accordingly, in modes 1-3 operation, a reverse conduction loss through the GaN HEMT $26_1$ that might have been occurred if the GaN HEMT $26_1$ were used alone is thus avoided.

Mode 4: [$t_3$, $t_4$].

During the time period between times $t_3$, $t_4$, the upper GaN HEMT $26_1$ is ON and the upper Si MOSFET $34_1$ is OFF, while the lower switches also remain off (i.e., the lower switches $26_2$, $34_2$ remain off). This is because (i) notwithstanding the de-assertion of the gate drive signal $16_1$ ($V_{G\_MOS1}$) to turn OFF the "upper" Si MOSFET, the delay block 22 has time delayed the corresponding de-assertion of the gate drive signal $24_1$ ($V_{G\_GaN1}$) controlling the upper GaN HEMT $26_1$. Also, the gate drive signals $16_2$, $24_2$ ($V_{G\_MOS2}$, $V_{G\_GaN2}$) are both de-asserted and thus in the OFF state. In sum, all switches are off except the upper GaN HEMT $26_1$. To realize ZVS for the lower hybrid switch arrangement, during this period, the polarity of the electrical current $I_L$ should be reversed, shown in FIG. 6. It should be appreciated that when the upper Si MOSFET $34_1$ is turned off by de-assertion of gate drive signal $16_1$ ($V_{G\_MOS1}$) that the GaN HEMT $26_1$ is still on, by virtue of the time delay inserted by delay block 22. As a consequence, therefore, the Si MOSFET $34_1$ s ZVS turned off. There is no switching-off loss for the upper Si MOSFET $34_1$.

In addition, although the upper GaN HEMT $26_1$ is hard turned off at t=$t_4$, experimental results show that the GaN HEMT $26_1$ turn off is ignorable. More specifically, compared to the hard turn-on loss, the above-mentioned hard turn-off loss is much smaller. Therefore, embodiments consistent with the teachings of the present disclosure are able to run at a much higher switching frequency, since the Si MOSFET switching loss is zero.

Mode 5: [$t_4$, $t_5$].

During the time period between times $t_4$, $t_5$, all of the switches are off (i.e., switches $26_k$, $34_1$, $26_2$, $34_2$). This is because all the gate drive signals are de-asserted and are in the OFF state. Again, similar to mode 1, since the body diode of the lower Si MOSFET $34_2$ exhibits a much lower voltage drop than that of the GaN HEMT $26_2$, the current $I_L$ will go through body diode of lower MOSFET $34_2$ instead, which exhibits about a 1~2V voltage drop only.

Mode 6: [$t_5$, $t_6$].

Figure 7:
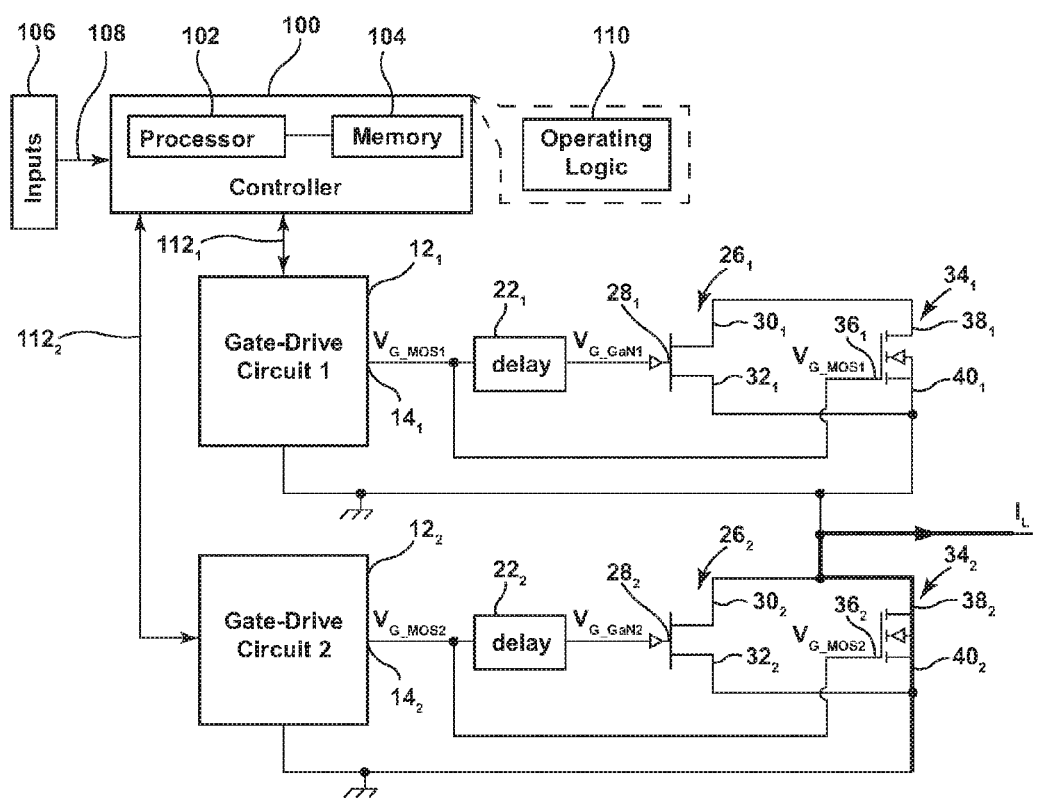

During the time period between times $t_5$, $t_6$, the lower Si MOSFET $34_2$ is on, while the other switches remain off (i.e., the other switches $26_k$, $26_2$, $34_1$ remain off). This is because (i) notwithstanding the assertion of the gate drive signal $16_2$ ($V_{G\_MOS1}$), the delay block 22 has time delayed the corresponding assertion of the gate drive signal $24_2$ ($V_{G\_GaN2}$); and (ii) the gate drive signals $16_1$, $24_1$ ($V_{G\_MOS1}$, $V_{G\_GaN1}$) are also both in the OFF state. Similar to mode 2 above, the current $I_L$ will flow through the lower Si MOSFET $34_2$ channel, as shown in FIG. 7. Since the GaN HEMT $26_2$ exhibits a roughly 7V drop in this example (see above in connection with Equation (1))—as compared to the much smaller voltage drop across the channel of the Si MOSFET $34_2$ (i.e., the MOSFET channel voltage drop is much smaller due to a small resistance—is ~mΩ), the current $I_L$ will flow through the lower Si MOSFET $34_2$ channel. In sum, the lower Si MOSFET is ON, which makes all current go through its channel. At time t=$t_6$, the lower GaN HEMT $16_2$ is ZVS ON—this occurs after the time delay inserted by the delay block has passed.

Therefore, in summary, the following features of the hybrid switch apparatus can be described. First, there is no current going through GaN HEMTs when all of the switches are OFF. Therefore, the relatively large reverse conduction loss can be avoided for GaN HEMTs. Second, all the Si MOSFETs are turned off when the GaN HEMTs are still on. Therefore, there is no switching off loss for the Si MOSFETs. Third, all the switches are ZVS turned-on. Therefore, all the Si MOSFETs do not have any switching loss but only at most conduction losses. Fourth, all the GaN HEMTs will only undertake the switching off loss with very little forward/reverse conduction loss and zero switching on loss. Therefore, all the conduction loss is undertaken by the Si MOSFETs. All the switching off losses are undertaken by the GaN HEMTs. The foregoing described hybrid switch apparatus fully utilizes the advantages of both the Si MOSFET devices as well as the GaN HEMT devices.

It should be understood that an electronic control unit as described herein may include conventional processing apparatus known in the art, capable of executing pre-programmed instructions stored in an associated memory, all performing in accordance with the functionality described herein. To the extent that the methods described herein are embodied in software, the resulting software can be stored in an associated memory and can also constitute the means for performing such methods. Implementation of certain embodiments, where done so in software, would require no more than routine application of programming skills by one of ordinary skill in the art, in view of the foregoing enabling description. Such an electronic control unit may further be of the type having both ROM, RAM, a combination of non-volatile and volatile (modifiable) memory so that any software may be stored and yet allow storage and processing of dynamically produced data and/or signals.

Although only certain embodiments have been described above with a certain degree of particularity, those skilled in the art could make numerous alterations to the disclosed embodiments without departing from the scope of this disclosure. It is intended that all matter contained in the above description or shown in the accompanying drawings shall be interpreted as illustrative only and not limiting. Changes in detail or structure may be made without departing from the invention as defined in the appended claims.

Any patent, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

While one or more particular embodiments have been shown and described, it will be understood by those of skill in the art that various changes and modifications can be made without departing from the spirit and scope of the present teachings.

What is claimed is:

1. An apparatus comprising:
   means for producing (i) a gate drive signal on a gate drive output and (ii) a delayed gate drive signal that is delayed relative to said gate drive signal, wherein said gate drive signal comprises an ON state and an OFF state;
   a first type of electrical switching device having a first gate, a first drain, and a first source;
   a second type of switching device different from said first type of switching device wherein said second type of switching device includes a second gate, a second drain, and a second source, said first type of switching device and said second type of switching device being electrically connected in a parallel arrangement wherein (i) said first drain and said second drain are electrically connected and (ii) said first source and said second source are electrically connected;
   wherein said first gate of said first type of switching device is electrically connected to said producing means to receive said delayed gate drive signal and said second gate of said second type of switching device is electrically connected to said producing means to receive said gate drive signal;
   wherein in said paralleled arrangement said second type of switching device has a source-drain reverse conduction voltage drop that is less than that of said first type of switching device such that when said gate drive signal and said delayed gate drive signal are in said OFF state, a reverse conduction current flow through said first type of switching device is inhibited relative to said second type of switching device.

2. The apparatus of claim 1 wherein said second type of switching device comprises a body diode between said second source and said second drain wherein said source-drain reverse conduction voltage drop is defined by said body diode when said gate drive signal and said delayed gate drive signal are in said OFF state.

3. The apparatus of claim 2 wherein said second type of switching device comprises a silicon (Si) MOSFET device.

4. The apparatus of claim 2 wherein said first type of switching device comprises a wide-bandgap (WBG) device.

5. The apparatus of claim 3 wherein said WBG device comprises one of a Silicon Carbide (SiC) device and a Gallium Nitride (GaN) HEMT.

6. The apparatus of claim 1 wherein said producing means comprises a gate drive circuit having at least one gate drive output configured to produce said gate drive signal on said gate drive output and a delay block having an output configured to produce said delayed gate drive signal.

7. The apparatus of claim 6 wherein said delay block comprises an resistor-capacitor (RC) circuit.

8. The apparatus of claim 1 wherein when said gate drive signal transitions from said ON state to said OFF state, said producing means delays a transition of said delayed gate drive signal from said ON state to said OFF state such that said second type of switching device is turned off while said first type of switching device remains on.

9. The apparatus of claim 8 wherein after said producing means delays a transition of said delayed gate drive signal from said ON state to said OFF state, said delayed gate drive signal in said OFF state turns off said first type of switching device wherein a switching-off loss of said apparatus is substantially undertaken by said first type of switching device.

10. The apparatus of claim 1 further comprising an electronic control unit configured to control said gate drive circuit in accordance with a zero voltage switching (ZVS) strategy, wherein said electronic control unit is configured to control said producing means to output said gate drive signal in said ON and OFF state, and wherein said electronic control unit is further configured to control said producing means in accordance with said ZVS strategy so as to transition said gate drive signal from said OFF state to said ON state.

11. The apparatus of claim 1 wherein said first type of switching device and said second type of switching device form a first hybrid switch arrangement, said apparatus further comprising a second hybrid switch arrangement replicating said first hybrid switch arrangement, and wherein said first and second sources of said first hybrid switch arrangement are connected to said first and second drains of said second hybrid switch arrangement at a common node.

12. The apparatus of claim 10 wherein said first and second hybrid switch arrangements are used in a bridge circuit.

13. An apparatus comprising:
   means for producing (i) a gate drive signal on a gate drive output and (ii) a delayed gate drive signal that is delayed relative to said gate drive signal, wherein said gate drive signal comprises an ON state and an OFF state;
   a first type of electrical switching device comprising a wide-bandgap (WBG) device having a first gate, a first drain, and a first source;
   a second type of switching device different from said first type of switching device wherein said second type of switching device includes a second gate, a second drain, and a second source, said first type of switching device and said second type of switching device being electrically connected in a parallel arrangement wherein (i) said first drain and said second drain are electrically connected and (ii) said first source and said second source are electrically connected;
   wherein said first gate of said first type of switching device is electrically connected to said producing means to receive said delayed gate drive signal and said second gate of said second type of switching device is electrically connected to said producing means to receive said gate drive signal;
   wherein in said paralleled arrangement said second type of switching device has a body diode between said second source and said second drain such that when said gate drive signal and said delayed gate drive signal are in said OFF state, a reverse conduction current flow through said second type of switching device is promoted and is inhibited in said first type of switching device; and
   wherein when said gate drive signal transitions from said ON state to said OFF state, said producing means delays a transition of said delayed gate drive signal from said ON state to said OFF state such that said second type of switching device is turned off while said first type of switching device remains on.

14. The apparatus of claim 13 wherein said second type of switching device comprises a silicon (Si) MOSFET device.

15. The apparatus of claim 13 wherein said WBG device comprises one of a Silicon Carbide (SiC) device and a Gallium Nitride (GaN) HEMT.

16. The apparatus of claim 13 wherein said producing means comprises a gate drive circuit having at least one gate drive output configured to produce said gate drive signal on said gate drive output and a delay block having an output configured to produce said delayed gate drive signal.

17. The apparatus of claim 13 wherein after said producing means delays a transition of said delayed gate drive signal from said ON state to said OFF state, said delayed gate drive signal in said OFF state turns off said first type of switching device wherein a switching-off loss of said apparatus is substantially undertaken by said first type of switching device.

18. The apparatus of claim 13 further comprising an electronic control unit configured to control said gate drive circuit in accordance with a zero voltage switching (ZVS) strategy, wherein said electronic control unit is configured to control said producing means to output said gate drive signal in said ON and OFF state, and wherein said electronic control unit is further configured to control said producing means in accordance with said ZVS strategy so as to transition said gate drive signal from said OFF state to said ON state.

19. The apparatus of claim 13 wherein said first type of switching device and said second type of switching device form a first hybrid switch arrangement, said apparatus further comprising a second hybrid switch arrangement replicating said first hybrid switch arrangement, and wherein said first and second sources of said first hybrid switch arrangement are connected to said first and second drains of said second hybrid switch arrangement at a common node.

20. The apparatus of claim 19 wherein said first and second hybrid switch arrangements are used in a bridge circuit.

\* \* \* \* \*